(12) United States Patent
You et al.

(10) Patent No.: US 6,410,458 B1
(45) Date of Patent: Jun. 25, 2002

(54) METHOD AND SYSTEM FOR ELIMINATING VOIDS IN A SEMICONDUCTOR DEVICE

(75) Inventors: Lu You, Santa Clara; Dawn Hopper; John Jianshi Wang, both of San Jose, all of CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/494,755

(22) Filed: Jan. 31, 2000

Related U.S. Application Data

(60) Provisional application No. 60/168,142, filed on Nov. 29, 1999.

(51) Int. Cl.[7] ............................................. H01L 23/48
(52) U.S. Cl. ..................... 438/782; 438/758; 438/761; 438/780; 438/781
(58) Field of Search ................................ 438/758, 761, 438/780, 781, 782

(56) References Cited

U.S. PATENT DOCUMENTS 5,818,111 A * 10/1998 Jeng et al. .................. 257/776

* cited by examiner

Primary Examiner—Chandra Chaudhari
Assistant Examiner—Lisa Kilday
(74) Attorney, Agent, or Firm—Sawyer Law Group LLP

(57) ABSTRACT

The present invention is a method and system for eliminating voids in a semiconductor device. The method comprises the steps of forming metal lines over a semiconductor substrate, forming a first oxide layer utilizing a high density plasma deposition technique, forming a second oxide layer utilizing a carbon free resin and forming a topside dielectric layer. Through the use of a method in accordance with the present invention, the voids that are created in the dielectric films during conventional semiconductor processing methodology are eliminated. The use of a high density plasma deposition technique provides a more directional deposition that can get between metal lines that are separated by smaller gaps. The dielectric films are thereby strengthened, which increases the reliability of the semiconductor device. Furthermore, by utilizing hydrogen silsesquiloxane instead of a conventional spin-on glass, there is no concern regarding carbon contamination since hydrogen silsesquiloxane doesn't contain carbon atoms.

8 Claims, 4 Drawing Sheets

METHOD AND SYSTEM FOR ELIMINATING VOIDS IN A SEMICONDUCTOR DEVICE

This application claims the benefit of U.S. provisional application No. 60/168,142, filed Nov. 29, 1999.

FIELD OF INVENTION

The present invention relates generally to semiconductor devices and more specifically to a method and system for eliminating voids in semiconductor devices.

BACKGROUND OF THE INVENTION

Semiconductor manufacturers have increasingly turned to high density Metal Oxide Semiconductor (MOS) arrays in their integrated circuit design schemes. To achieve a high density integrated circuit, features such as metal-oxide semiconductor field-effect transistors (MOSFETs) must be as small as possible. This means scaling down metal thickness as spacer gaps are narrowed, thereby increasing the MOSFET aspect ratio. Typically, of these high density flash memory integrated circuits utilize NAND-type gates as opposed to NOR-type gates since NAND gates have a considerably higher density than NOR gates. Smaller transistors allow more transistors to be placed on a single substrate, thereby allowing relatively large circuit systems to be incorporated on a single, relatively small die area.

FIG. 1 illustrates a cross section of metal lines that can form the inner connect to device transistors. The metal lines 100 and 150 are on a substrate surface 108. The metal lines 100, 150 are separated by a spacer gap 104. A dielectric oxide liner 110 is deposited using a conventional chemical vapor deposition (CVD) methodology. A spin-on glass (SOG) 112 is then applied, followed by the application of a topside dielectric film 114.

For a better understanding of a conventional method of processing a semiconductor device please refer to the flowchart of FIG. 2. Once the metal lines are in place, a first oxide liner is deposited using a CVD technique, via step 200. Next, a spin-on glass is utilized to form a second oxide layer, via step 202. Finally, a protective topside dielectric film is formed, via 204.

The deposition of a dielectric film with uniform electronic properties is desirable since unaccounted for changes in the properties of the dielectric layer can produce drastic changes in the performance of the semiconductor device. However, as dimensions are reduced in each new generation of integrated circuit, it becomes more difficult to deposit dielectric material on the top metal layer utilizing conventional methodology. For example, as a result of smaller metal lines and gaps (0.35 microns or lower), the formation of voids during the conventional process becomes a significant concern. Voids create weaknesses in the topside dielectric film which reduces the reliability of the device.

Accordingly, what is needed is a method for eliminating voids in the topside dielectric film of semiconductor devices. The present invention addresses such a need.

SUMMARY OF THE INVENTION

The present invention is a method and system for eliminating voids in a semiconductor device. The method comprises the steps of forming metal lines over a semiconductor substrate, forming a first oxide layer utilizing a high density plasma deposition technique, forming a second oxide layer utilizing a carbon free resin and forming a topside dielectric layer.

Through the use of a method in accordance with the present invention, the voids that are created in the dielectric films during conventional semiconductor processing methodology are eliminated. The use of a high density plasma deposition technique provides a more directional deposition that can get between metal lines that are separated by smaller gaps. The dielectric films are thereby strengthened, which increases the reliability of the semiconductor device. Furthermore, by utilizing hydrogen silsesquioxane instead of a conventional spin-on glass, there is no concern regarding carbon contamination since hydrogen silsesquioxane doesn't contain carbon atoms.

DETAILED DESCRIPTION OF THE INVENTION

The present invention provides a method and system for processing a semiconductor. The following description is presented to enable one of ordinary skill in the art to make and use the invention and is provided in the context of a patent application and its requirements. Various modifications to the preferred embodiment will be readily apparent to those skilled in the art and the generic principles herein may be applied to other embodiments. Thus, the present invention is not intended to be limited to the embodiments shown but is to be accorded the widest scope consistent with the principles and features described herein.

The method and system in accordance with the present invention is described in the context of a preferred embodiment. The preferred embodiment utilizes a high density plasma deposition technique to provide a first oxide layer and utilizes a hydrogen silsesquioxane resin to form a second oxide layer. Through the use of a method in accordance with the present invention, the voids that are created in the dielectric films during conventional semiconductor processing methodology are eliminated. The use of a high density plasma deposition technique provides a more directional deposition that can get between metal lines that are separated by smaller gaps. The dielectric films are thereby strengthened, which increases the reliability of the semiconductor device. Furthermore, by utilizing hydrogen silsesquioxane instead of a conventional spin-on glass, there is no concern regarding carbon contamination since hydrogen silsesquioxane doesn't contain carbon atoms. Also, the hydrogen silsesquioxane smoothes out the rough surfaces created by the high density plasma deposition technique.

Figure 1:
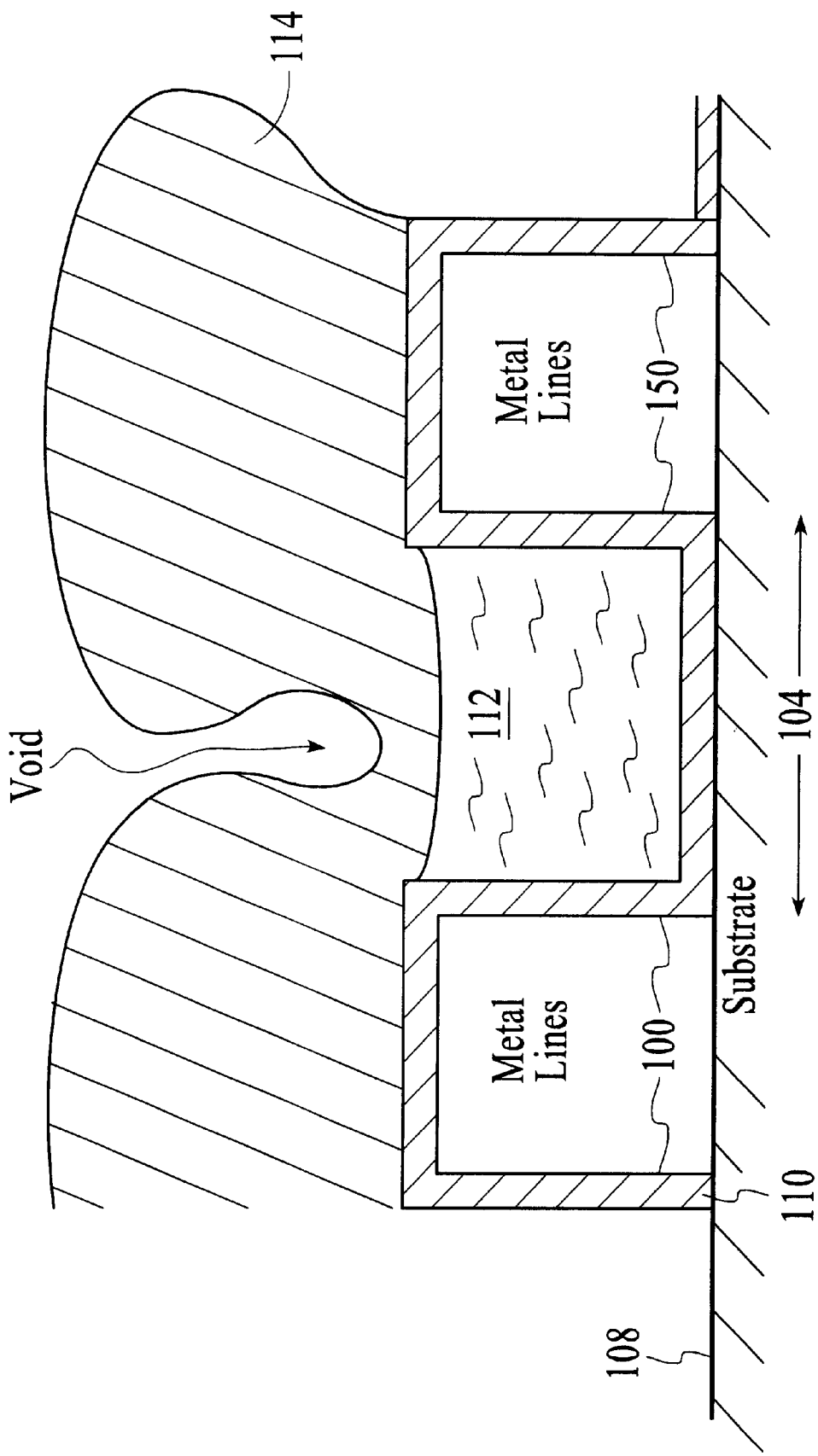
FIG. 1 is a cross section of a conventional metal line configuration.
Figure 2:
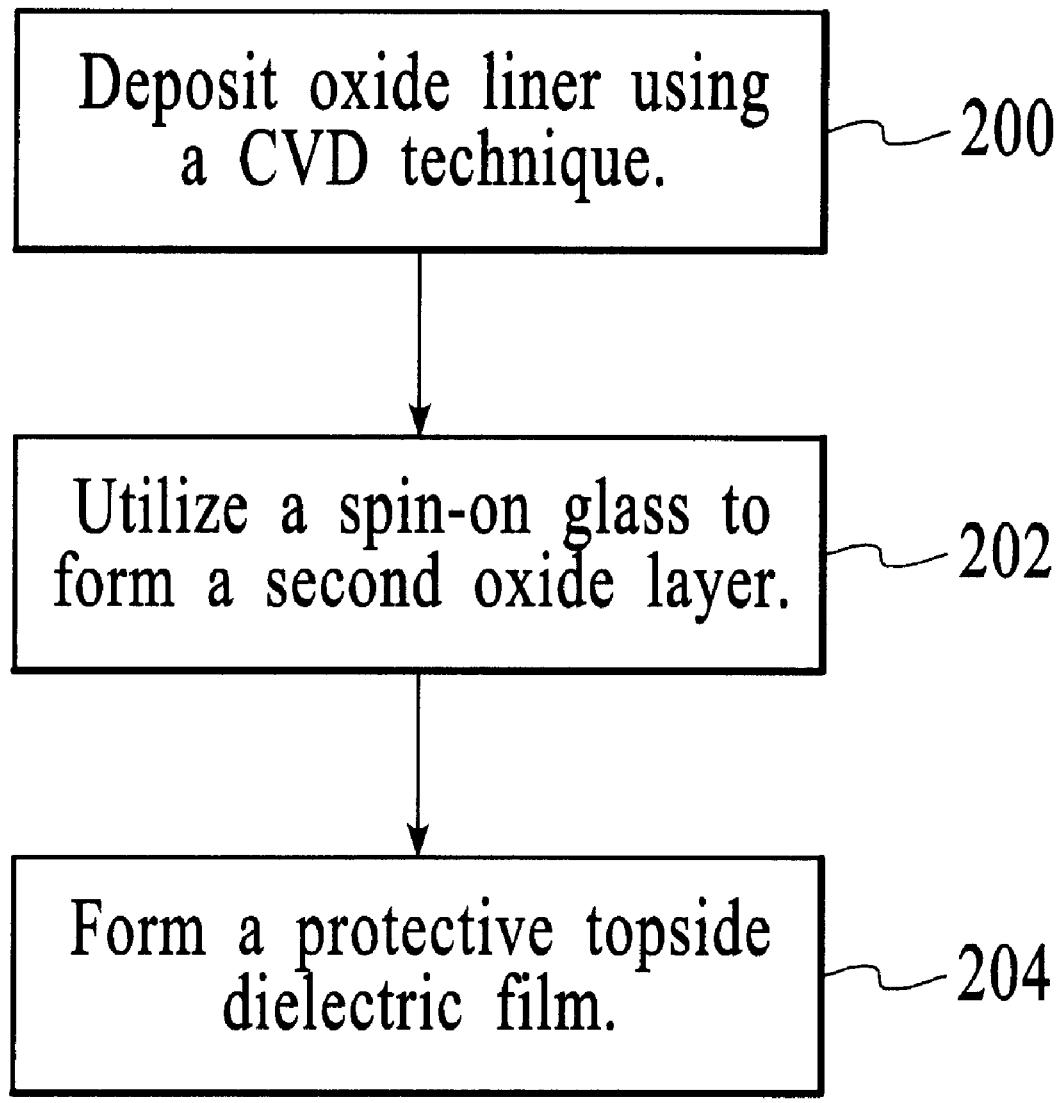
FIG. 2 is a flowchart of a conventional method of processing a semiconductor device.
Figure 3:
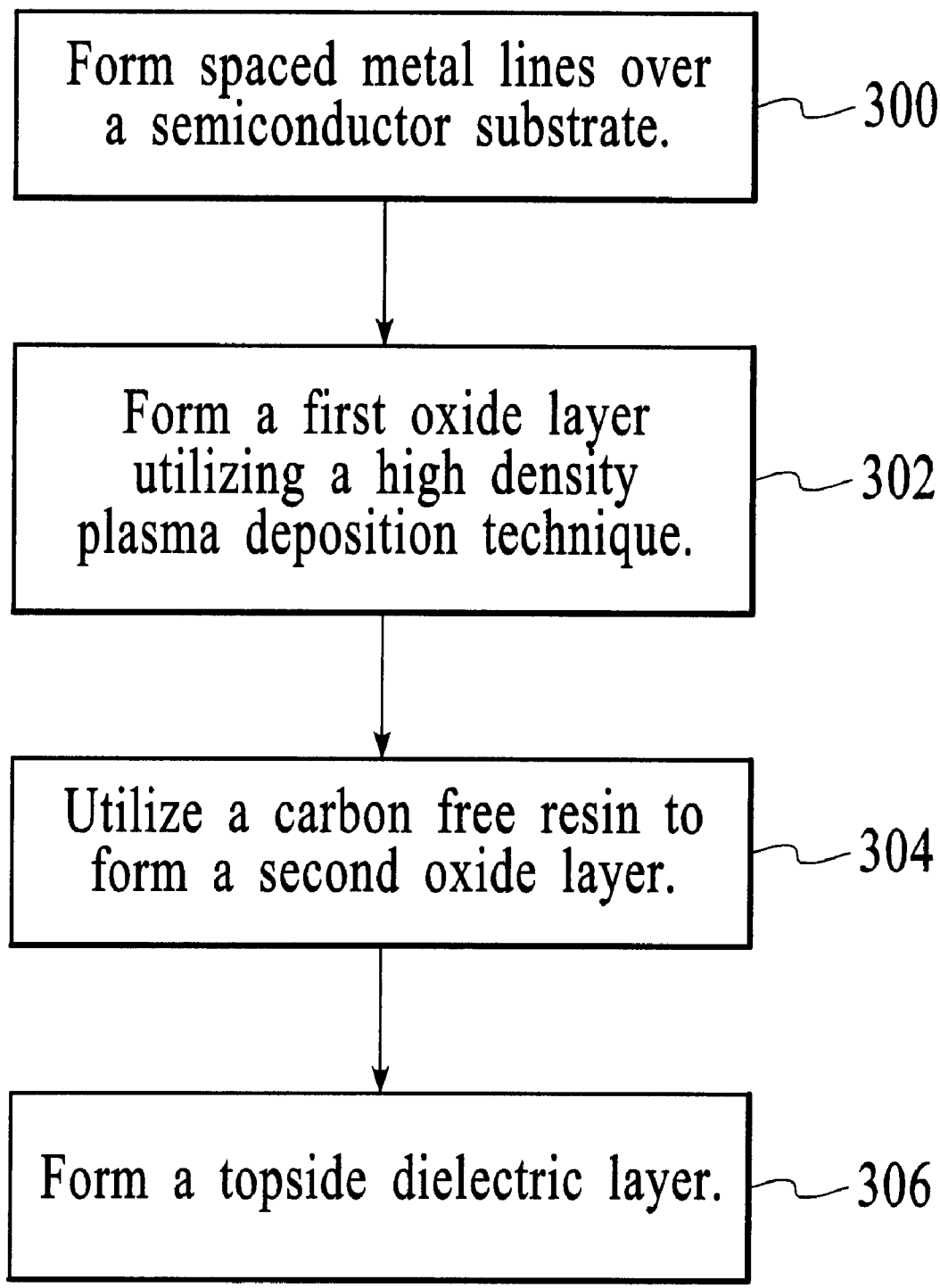
FIG. 3 is a flowchart of the method in accordance with the present invention.

To further describe the method in accordance with the present invention, refer now to FIG. 3. FIG. 3 is a flowchart of the method in accordance with the present invention. First, a plurality of spaced metal lines are formed over a semiconductor substrate, via step 300. Next, a first oxide layer is formed utilizing a high density plasma deposition technique, via step 302. A second oxide layer is then formed utilizing a carbon free resin, via step 304. Finally, a topside dielectric layer is formed, via step 306. Preferably, the topside dielectric layer is a silicon nitride film.

As previously stated, in accordance with the present invention a high density plasma deposition technique is preferably utilized to provide first insulating oxide layer between the metal lines in a semiconductor device. High density deposition systems typically utilize a plasma as the deposition medium. These systems are generally operated with a very high plasma density (e.g. $10^{10}$–$10^{12}$ charges/cm$^3$) and at a very low pressure (e.g. 0.1 mtorr 200 mtorr). In these types of deposition systems the plasma is typically generated in a separate chamber using a source of electromagnetic radiation (e.g. microwave or low frequency whistler waves.) Antennae are then used to initiate wave coupling between the source and a gas that is injected into the chamber. Magnetic fields are often used to control the flow direction of the ions and to provide a uniform plasma density over a large circular area. The substrate is capacitively coupled to an rf bias source which accelerates the depositing ions contained in the plasma towards the substrate.

Although a particular high density plasma deposition technique is described above, one of ordinary skill in the art will readily recognize that a variety of high density plasma deposition techniques could be used while remaining within the spirit and scope of the present invention.

Figure 4:
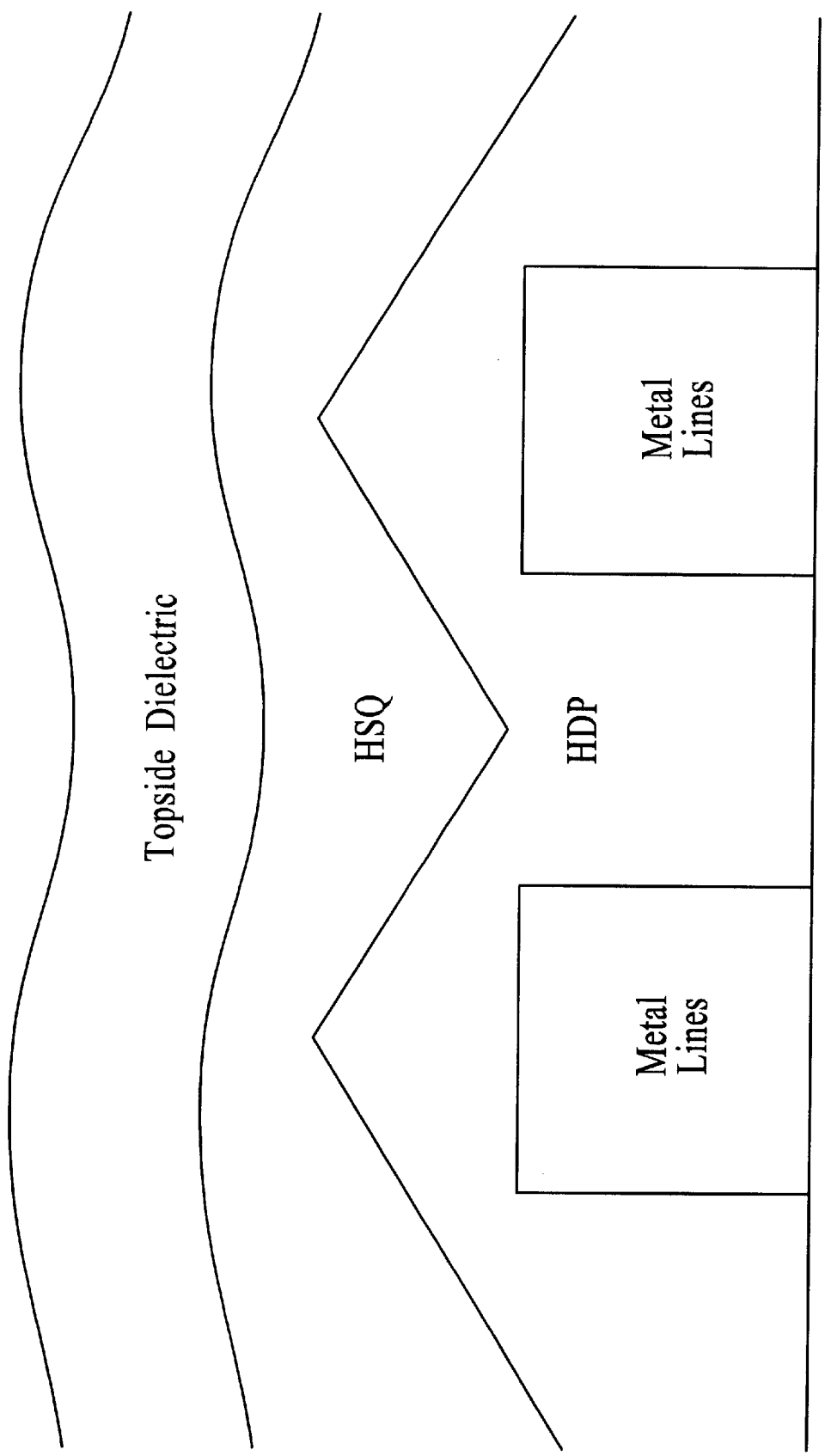
FIG. 4 is a cross section of a metal line configuration in accordance with the present invention.

Preferably, the spin-on glass material utilized in the conventional methodology is replaced with a carbon free resin, preferably a hydrogen silsesquiloxane (HSQ) resin. This is advantageous because by using relatively carbon free resins, like HSQ, it is not necessary to etch back the HSQ to avoid shorting. In addition, HSQ exhibits excellent planarity and is capable of gap filling spacings less than 0.15 microns employing conventional spin-on equipment. FIG. 4 illustrates a cross section of a metal line configuration in accordance with the present invention.

Although the preferred embodiment of the present invention contemplates the use of a hydrogen silsesquiloxane resin, one of ordinary skill in the art will readily recognize that a variety of carbon free resins could be used while remaining within the spirit and scope of the present invention.

Through the use of a method in accordance with the present invention, the voids that are created in the topside dielectric films during conventional semiconductor processing methodology are eliminated. The use of a high density plasma deposition technique provides a more directional deposition that can get between metal lines that are separated by smaller gaps. The topside dielectric is thereby strengthened, which increases the reliability of the semiconductor device. Furthermore, by utilizing hydrogen silsesquiloxane instead of a conventional spin-on glass, there is no concern regarding carbon contamination since hydrogen silsesquiloxane doesn't contain carbon atoms.

Although the present invention has been described in accordance with the embodiments shown, one of ordinary skill in the art will readily recognize that there could be variations to the embodiments and those variations would be within the spirit and scope of the present invention. Accordingly, many modifications may be made by one of ordinary skill in the art without departing from the spirit and scope of the appended claims.

What is claimed is:

1. A method for eliminating voids in a semiconductor device, comprising the steps of:
    a) forming a plurality of spaced metal lines over a semiconductor substrate, wherein the plurality of spaced metal lines are separated by spacer gaps;
    b) filling the spacer gaps between the plurality of spaced metal lines with a first oxide layer utilizing a high density plasma deposition technique;
    c) forming a second oxide layer over the first oxide layer utilizing a carbon free resin, wherein the second oxide layer provides a planarized surface; and
    d) forming a topside dielectric layer over the second oxide layer.

2. The method of claim 1 wherein the carbon free resin comprises a hydrogen silsesquioxane resin.

3. The method of claim 1 wherein step b) further comprises annealing the semiconductor device with a forming gas at an annealing temperature.

4. The method of claim 3 wherein the forming gas is $H_2N_2$.

5. The method of claim 3 wherein the annealing temperature is at least 400° C.

6. The method of claim 3 wherein the annealing is performed immediately after the high density plasma deposition technique.

7. The method of claim 1 wherein the topside dielectric layer comprises silicon nitride.

8. A method for depositing insulating layers over spaced metal lines on a semiconductor device, comprising the steps of:
    a) forming spaced metal lines over a semiconductor substrate, wherein the spaced metal lines are separated by spacer gaps;
    b) filling the spacer gaps between the spaced metal lines with a first oxide layer utilizing a high density plasma deposition technique;
    c) annealing the semiconductor device with H2N2 at a temperature of at least 400° C. immediately after step b);
    d) forming a second oxide layer over the first oxide layer utilizing a hydrogen silsesquioxane resin, wherein the second oxide layer provides a planarized surface; and
    e) forming a topside dielectric layer of silicon nitride over the second oxide layer.

* * * * *